United States Patent
Sato

[11] Patent Number: 6,124,725
[45] Date of Patent: Sep. 26, 2000

[54] APPARATUS AND METHOD FOR TESTING SEMICONDUCTOR DEVICES FORMED ON A SEMICONDUCTOR WAFER

[75] Inventor: Takashi Sato, Nirasaki, Japan

[73] Assignee: Tokyo Electron Limited, Tokyo, Japan

[21] Appl. No.: 09/199,782

[22] Filed: Nov. 25, 1998

[30] Foreign Application Priority Data

Nov. 29, 1997 [JP] Japan ................................ 9-344205

[51] Int. Cl.⁷ ........................... G01R 31/26; G01R 31/02
[52] U.S. Cl. ........................ 324/765; 324/754; 324/758
[58] Field of Search ................................ 324/765, 754, 324/758, 767, 756

[56] References Cited

U.S. PATENT DOCUMENTS

| | | | |
|---|---|---|---|
| 5,049,816 | 9/1991 | Moslehi | 324/767 |
| 5,517,126 | 5/1996 | Yamaguchi | 324/758 |
| 5,570,032 | 10/1996 | Atkins et al. | 324/760 |
| 5,912,555 | 6/1999 | Akaike et al. | 324/758 |
| 5,945,834 | 8/1999 | Nakata | 324/754 |

FOREIGN PATENT DOCUMENTS 64-35926  2/1989  Japan.

*Primary Examiner*—Safet Metjahic
*Assistant Examiner*—James C Kerveros
*Attorney, Agent, or Firm*—Oblon, Spivak, McClelland, Maier & Neustadt, P.C.

[57] ABSTRACT

The present specification and drawings disclose a testing apparatus designed for testing semiconductor elements formed on a semiconductor wafer. The testing apparatus comprises a main chuck having a surface on which a semiconductor wafer is placed, a contactor which is brought into contact with the semiconductor wafer, the contactor having probe terminals which are simultaneously brought into electric contact with a plurality of semiconductor elements formed on the semiconductor wafer, a reliability test mechanism for testing reliability of the semiconductor elements, an electric characteristic test mechanism for testing electric characteristics of the semiconductor element, and a switch mechanism for switching between the reliability test mechanism and the electric characteristic test mechanism such that the reliability test mechanism and the electric characteristic test mechanism are sequentially connected to the contactor when this contactor is in contact with the semiconductor wafer placed on the main chuck.

10 Claims, 5 Drawing Sheets

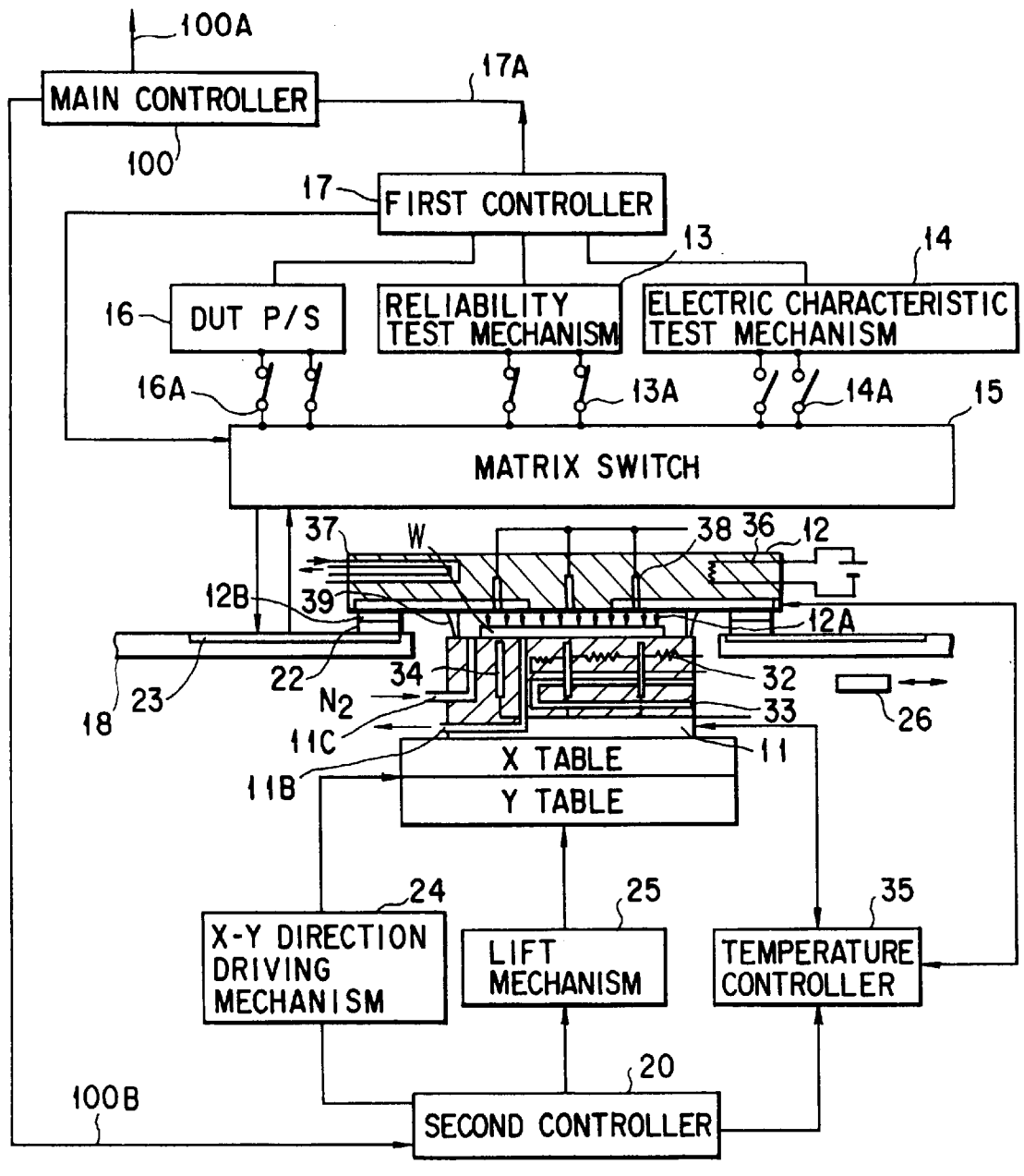
F I G. 1

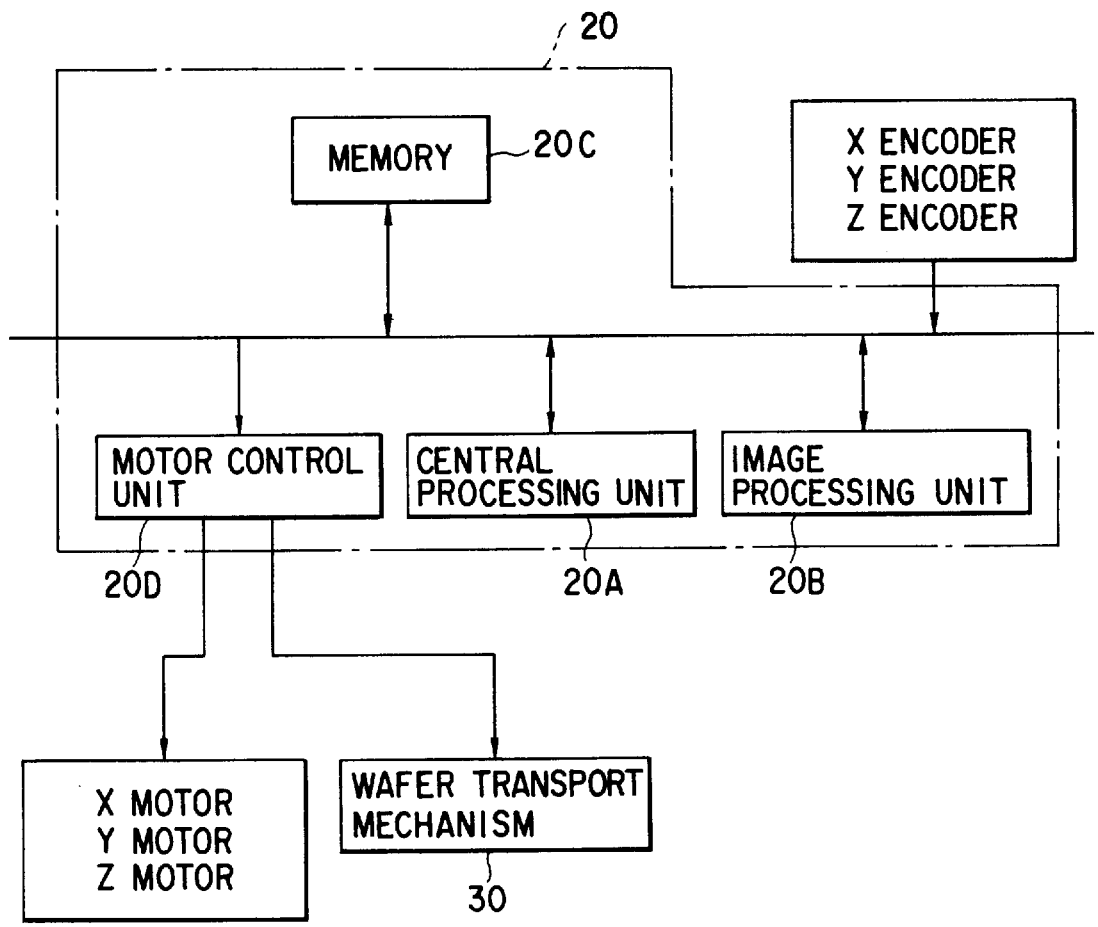
F I G. 4

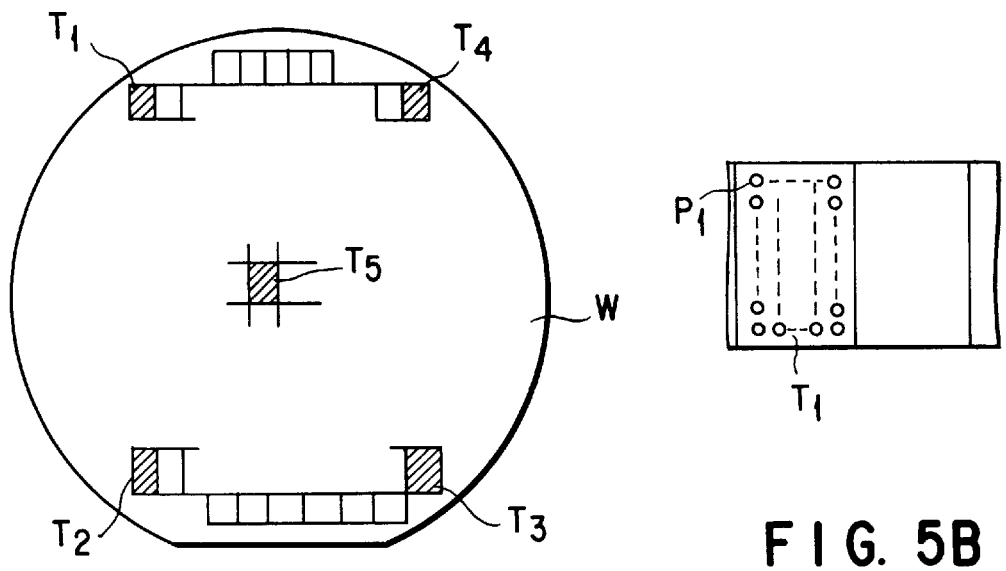
FIG. 5A
FIG. 5B
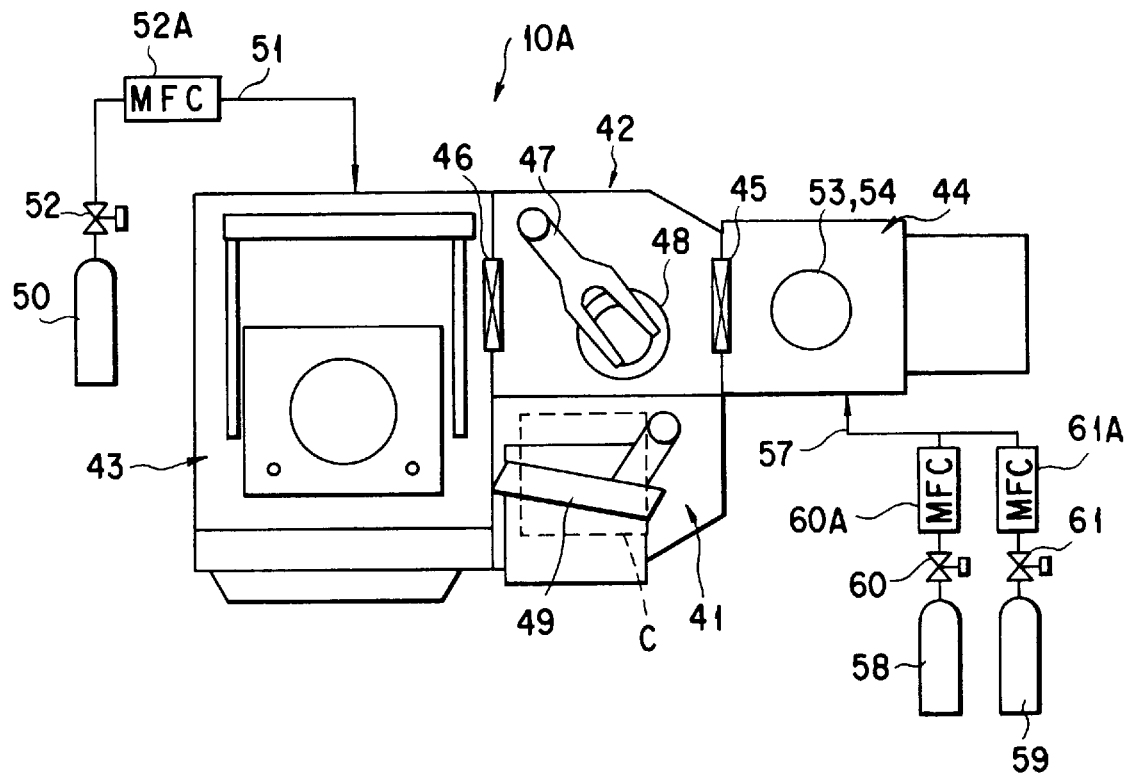
FIG. 6

APPARATUS AND METHOD FOR TESTING SEMICONDUCTOR DEVICES FORMED ON A SEMICONDUCTOR WAFER

BACKGROUND OF THE INVENTION

The present invention relates to a testing apparatus and a testing method, which are adapted for testing the semiconductor devices formed on a semiconductor wafer (hereinafter referred to simply as a wafer). More specifically, the invention relates to a testing apparatus and a testing method, which are designed to execute both a reliability test and an electric characteristic test (e.g., a high-speed test, a low-speed test) with respect to semiconductor devices formed on the wafer. (The semiconductor devices will be referred to simply as chips.)

In the semiconductor test process, an electric characteristic test is carried out for each of the chips formed on a wafer. By this test, the chips are screened to select those chips that are not defective in their electric characteristics. Good chips selected by the screening are then packaged by use of a synthetic resin or ceramic material in the subsequent assembling process. A reliability test is executed with respect to the packaged chips.

In the reliability test, thermal stress and electric stress are applied to the packaged chips so as to check whether they have potential defects.

Those chips which are determined as defective in the reliability test are removed, and a final electric characteristic test is executed only for the chips that are determined as good. In this manner, good-quality products are shipped from the factory.

In recent years, more and more small-sized sophisticated electric appliances have been developed. In accordance with this trend, efforts are being made for the miniaturization and high integration of chips. In order to provide small-sized electric appliances, flip chip technology has been developed. In this technology, so-called bare chips (i.e., chips that are not packaged) are mounted on circuit boards, and the market for bare chips has been developed. Before bare chips are put on the market, a reliability test has to be executed for them by use of a burn-in test apparatus. This test should not be carried out for the bare chips individually since the bare chips have to be handled with special care. Under the circumstances, a technique for executing a burn-in test with respect to the chips formed on the wafer has been developed. Such a technique is disclosed in Jpn. Pat. Appln. KOKAI Publications No. 7-231019, No. 8-5666 and No. 8-340030, for example.

Where bare chips are subjected to a reliability test in the state where they are formed on the wafer, quality-guaranteed bare chips can be dealt with in units of one wafer. This is very convenient in trading the bare chips.

However, the test time required for testing highly-integrated multi-bit chips is inevitably long. In addition, the number of multiple dies to be tested is restricted. Accordingly, the throughput is degraded, and the cost needed for the test is increased. Another problem is that there are two kinds of tests that have to be executed, one being an electric characteristic test which is executed by use of a probing apparatus, and the other being a reliability test which is executed by use of a burn-in testing apparatus. Broadly speaking, the former electric characteristic test includes two kinds: a low-speed/long-term test and a high-speed/high-accuracy test. It is therefore necessary to prepare three kinds of testing apparatuses: one for the high-speed test, another for the low-speed test, and the remaining one for the reliability test. The cost needed for these testing apparatuses is one cause of an increase in the test cost. Where a number of testing apparatuses are employed, the time needed for the transfer of wafers between these testing apparatuses cannot be neglected, further degrading the throughput of the test.

BRIEF SUMMARY OF THE INVENTION

The present invention has been developed to provide a solution to at least one of the problems described above.

One object of the present invention is to enable the electric characteristic test and the reliability test to be executed in succession.

Another object of the invention is to execute the two tests with high efficiency so as to improve the throughput.

Still another object of the present invention is to reduce the number of testing apparatuses required.

A further object of the invention is to reduce the cost required for the tests.

According to one aspect of the present invention, there is provided a testing apparatus which is designed for testing semiconductor devices formed on a semiconductor wafer and which comprises:

- a main chuck having a surface on which a semiconductor wafer is placed;
- a contactor which is brought into contact with the semiconductor wafer, the contactor having probe terminals which are simultaneously brought into electric contact with a plurality of semiconductor devices formed on the semiconductor wafer;
- a reliability test mechanism for testing reliability of the semiconductor devices;
- an electric characteristic test mechanism for testing electric characteristics of the semiconductor devices; and
- a switch mechanism for switching between the reliability test mechanism and the electric characteristic test mechanism such that the reliability test mechanism and the electric characteristic test mechanism are sequentially connected to the contactor when this contactor is in contact with the semiconductor wafer placed on the main chuck.

In the testing apparatus described above, it is preferable that the main chuck include a vacuum absorption mechanism for causing the semiconductor wafer to be absorbed on the surface of the main chuck, and that at least one of the main chuck and the contactor include gas supply means for supplying an inert gas into a gap which is formed between the contactor and the semiconductor wafer when the contactor and the semiconductor wafer are in contact with each other.

In the testing apparatus described above, it is also preferable that one of the main chuck and the contactor include a seal member for sealing the gap which is for med between the contactor and the semiconductor wafer when the contactor and the semiconductor wafer are in contact with each other.

In the testing apparatus described above, it is further preferable that the contactor include a temperature sensor for measuring the temperature of the semiconductor wafer.

It is preferable that the testing apparatus described above further comprise an oxide film removing mechanism for removing an oxide film from surfaces of electrodes of the semiconductor devices formed on the semiconductor wafer.

It is also preferable that the testing apparatus described above further comprise a plasma processing apparatus as an oxide film removing mechanism for removing an oxide film from surfaces of electrodes of the semiconductor devices formed on the semiconductor wafer.

According to another aspect of the present invention, there is provided a testing method which is adapted for testing semiconductor devices formed on a semiconductor wafer and which comprises the steps of:

placing a semiconductor wafer on a main chuck;

bringing a contactor into contact with the semiconductor wafer, the contactor having probe terminals which are simultaneously brought into electric contact with electrodes of a plurality of semiconductor devices formed on the semiconductor wafer;

executing a reliability test by use of the contactor which is in contact with the semiconductor wafer; and executing an electric characteristic test by use of the contactor which is in contact with the semiconductor wafer.

In the testing method described above, it is preferable that the step of placing the semiconductor wafer on the main chuck be preceded by a step of removing an oxide film from the surfaces of the electrodes of the semiconductor devices formed on the semiconductor wafer.

In the testing method described above, it is also preferable that the step of placing the semiconductor wafer on the main chuck be preceded by a step of subjecting the semiconductor wafer to plasma processing, to thereby remove an oxide film from the surfaces of the electrodes of the semiconductor devices formed on the semiconductor wafer.

In the testing method described above, it is further preferable that at least one of the reliability test and the electric characteristic test be executed in such a manner that an inert gas be kept supplied to a gap between the contactor and the semiconductor wafer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows a major part of a wafer testing apparatus according to one embodiment of the present invention;

FIG. 4 is a block circuit diagram of a control system, which is employed in the wafer testing apparatus depicted in FIG. 1;

FIG. 5A shows how chips are arranged on the wafer with reference to the positioning;

FIG. 5B is a plan view showing one chip on a large scale;

FIG. 6 is a plan view showing a wafer testing apparatus according to another embodiment of the present invention;

DETAILED DESCRIPTION OF THE INVENTION

Figure 2:
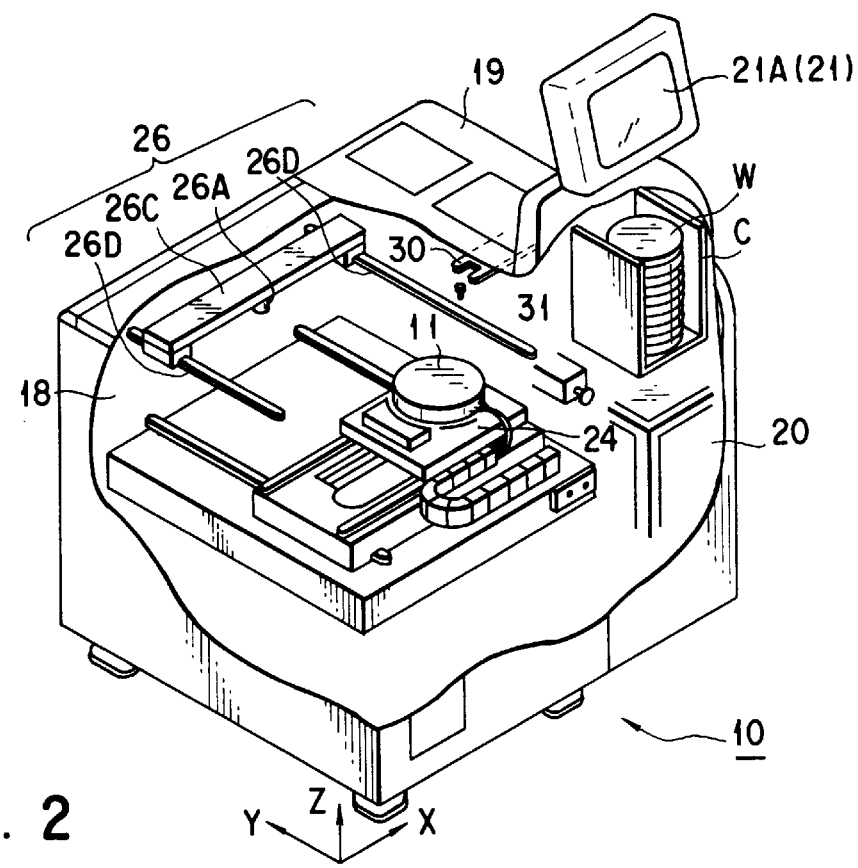
FIG. 2 is a perspective view showing the test and transport chambers of the wafer testing apparatus depicted in FIG. 1.

The present invention will be described, referring to the embodiments shown in FIGS. 1 through 8. As shown in FIGS. 1 and 2, a wafer testing apparatus 10 comprises: a main chuck 11 which is movable in X, Y, Z and θ directions and adjustable in temperature; a contactor 12 having a large number of probe terminals 12A which are simultaneously brought into contact with electrode pads of chips formed on a wafer W placed on the main chuck 11; a reliability test mechanism 13 (comprising of a mechanism that comprises a pattern signal generator for generating pattern signals for a burn-in test) and an electric characteristic test mechanism 14 (comprising of a pattern signal generator for generating pattern signals for high- and low-speed tests) which are connectable to the contactor 12 and disconnectable therefrom; switch mechanisms 13A and 14A by means of which the test mechanisms 13 and 14 are connected or disconnected from the contactor 12;

And a matrix switch 15 for enabling signals to be exchanged between the test mechanisms 13, 14 and contactor 12, wherein the switch mechanisms 13A and 14A select the signals from the two test mechanisms 13 and 14, and the signals are transmitted sequentially to each chip or a predetermined number of chips by way of the contactor 12.

The matrix switch 15 is connected to the power supply source 16 in such a manner as to be disconnectable by means of a switch mechanism 16A. By means of this switch mechanism 16A, the power supply voltage from the power supply source 16 is applied to each of the chips, predetermined ones of them, or all of them.

The two test mechanisms 13 and 14, the power supply source 16 and the matrix switch 15 are driven under the control of a first controller 17. The first controller 17 is connected to a main controller 100 by means of a cable 17A. The main controller 100 is connected to a central control system (a host computer), not shown in the drawings, by means of an external network cable 100A, and is controlled thereby.

The burn-in test described above includes a static burn-in test and a dynamic burn-in test, and these burn-in tests are carried out on the basis of the pattern signals generated from the reliability test mechanisms 13.

The high-speed and low-speed tests described above are specifically an AC test. By this test, the function, timing margin, input/output voltage level margin of each chip are carried out on the basis of the pattern signals generated from the electric characteristic test mechanism high- and low-speed tests, so as to determine whether the electric characteristics of each chip are good or bad.

The results of these tests are supplied through the first controller 17 and the main controller 100 to the host computer, where they are stored.

As shown in FIG. 2, the wafer testing apparatus 10 comprises: a test chamber 18 in which the main chuck 11 is installed; a transport chamber 19 which is adjacent to the test chamber 18 and from which a wafer W is transported to the test chamber 18; and a second controller 20 or controlling devices arranged inside the chambers 18 and 19. A display device 21 is provided on top of the transport chamber 19. The screen 21A of the display device 21 displays the interior of the test chamber 18, and also displays an operation menu of the wafer testing apparatus 10.

The second controller 20 of the wafer testing apparatus 10 is connected to the main controller 100 by means of a cable 100B (FIG. 1). The main controller 100 controls the wafer testing apparatus 10 along with other wafer testing apparatuses in a centralized manner.

As shown in FIG. 1, the upper wall of the testing chamber 18 has a central opening, and the contactor 12 described above is arranged on the circumference of the central opening. The contactor 12 has a plurality of connection terminals (e.g., connection pads) 12B arranged around the region where the probe terminals 12A are provided. The connection pads 12B and the probe terminals 12A are connected together through multi-layered wiring arranged inside the contactor 12. The connection pads 12B of the contactor 12 are in electrical contact with connection terminals (e.g., pogo-pins, metallic bumps, specially-designed sockets, etc.), which are annually arranged around the central opening such that they correspond to the connection pads 12B. The pogo pins 22 are electrically connected to the matrix switch 15 through a printed circuit (not shown) of a printed circuit board 23.

The power supply voltage from the power supply source 16 is applied through the matrix switch 15 to a single chip or a predetermined number of chips. If the current flowing through the chip or chips exceeds a predetermined value, the related chip or chips are determined as defective. The power supply to such chips is cut off, and pattern signals are supplied to the remaining chips from the reliability test mechanism 13 and the electric characteristic test mechanism 14, so as to test those chips.

The main chuck 11 is arranged in such a manner that the upper side thereof corresponds to the central opening of the test chamber 18. The probe terminals 12A of the contactor 12 are simultaneously brought into contact with the electrodes of the chips formed on the wafer W placed on the main chuck 11. As shown in FIGS. 1 and 2, the main chuck 11 can be moved in X, Y, Z and θ directions by means of an X-Y direction driving mechanism 24, a Z-direction lift mechanism 25 and so on. An alignment mechanism 26, by which the wafer W is aligned accurately with the test position, is located above the main chuck 11.

Figure 3A:
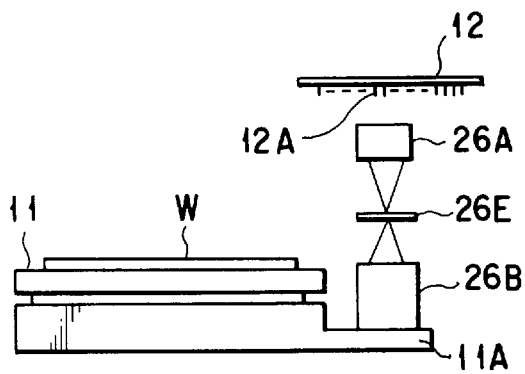
FIGS. 3A, 3B and 3C illustrate how a wafer and a contactor are adjusted in position relative to each other.
Figure 3B:
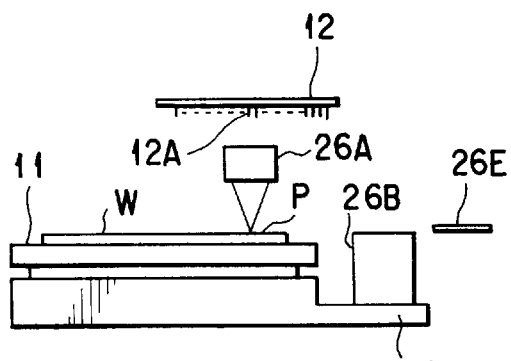
Figure 3C:
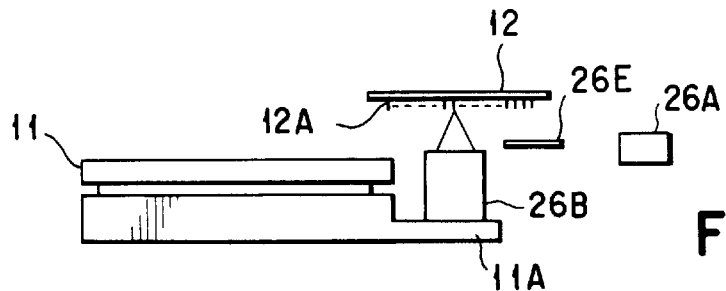

The alignment mechanism 26 comprises upper and lower CCD cameras 26A and 26B (the lower CCD camera 26B is shown in FIGS. 3A–3C.), an alignment bridge 26C on which the upper CCD camera is provided in such a manner as to be directed downward, and a pair of guide rails 26D for permitting the alignment bridge 26C to move to and fro in the Y direction. Each of the upper and lower CCD cameras 26A and 26B has a zoom mechanism, and its magnification can be adjusted between high and low in a stepless manner.

For wafer alignment, the upper CCD camera 26A takes an image of the wafer W placed on the main chuck 11 with high or low magnification, and the image obtained thereby is shown on the screen 21A of the display device 21.

As shown in FIGS. 3A–3C, the main chuck 11 has a horizontal fixing portion 11A at the circumference thereof. The lower CCD camera 26B is provided on this fixing portion 11A. When the wafer is aligned, the lower CCD camera 26B takes an image of the contactor 12 with a high or low magnification, and the image obtained thereby is shown on the screen 21A of the display device 21. A target 26E is located above the fixing portion 11A such that it is perpendicular to the optical axis of the lower CCD camera 26B. The target 26E is used for bringing the lower CCD camera into focus. The target 26E can be advanced or retreated from the focal position of the lower CCD camera 26B. It is made up, for example, of a glass plate, and a metallic thin film deposited on the surface of the glass plate. The position of the target on which the focal points of the upper and lower CCD cameras 26A and 26B are present is utilized as a reference position for wafer pre-alignment.

As shown in FIG. 2, a wafer transport mechanism 30 and a sub-chuck 31 are arranged inside the transport chamber 19. Before the wafer W in a cassette C is transported to the test chamber 18 by the wafer transport mechanism 30, it is placed on the sub-chuck 31, where pre-alignment is executed by using an orientation flat or notch as a reference. After the pre-alignment, the wafer W is transferred from the wafer transport mechanism 30 to the main chuck 11.

As shown in FIG. 4, the second controller 20 comprises a central processing unit 20A, an image processing unit 20B, a memory 20C and a motor control unit 20D. The second controller 20 controls the driving of an X-Y direction driving mechanism 24, the Z-direction lift mechanism 25, the alignment mechanism 26, the wafer transport mechanism 30 and the sub-chuck 31. (The first three structural components are shown in FIG. 1, and the last two are shown in FIG. 2.) In accordance with the program stored in the memory 20C, the central processing unit 20A changes over the matrix switch 15, transmits a control signal to the motor control unit 20D, calculates distances for movement in the X, Y, Z and θ directions from the pulse signals received from an encoder, calculates position data or other data on the main chuck 11, stores data on the results of calculation in the memory 20C, etc.

The image processing section 20B processes the image signals sent from the upper and lower CCD cameras 26A and 26B. The images obtained by this processing are shown on the screen 21A of the display device 21. The images are also stored in an image memory and compared with image data already stored therein. It is also determined whether the images photographed by the upper and lower CCD cameras 26A and 26B are in focus. Results of this determination are stored in the memory 20C of the second controller 20.

The main chuck 11 and the contactor 12 will be described with reference to FIG. 1. The main chuck 11 is provided with a heater 32 arranged at a position close to the surface. A refrigerant path 33 is formed under the heater 32 in such a pattern as enables the entire main chuck 11 to be cooled. A refrigerant (e.g., ethylene glycol, water, air, or the like) cooled by a cooler (not shown) is circulated through the refrigerant path 33.

A plurality of temperature sensors 34 (for example, three temperature sensors) are provided in the main chuck 11. Each sensor 34 measures the temperature at a position in the neighborhood of the surface of the main chuck 11. On the basis of the temperatures measured by the temperature sensors 34, a temperature controller 35 operates. The temperature of the main chuck 11 is controlled to be within the range of −50° C. to +180° C., for example. A vacuum exhaust path 11B is formed inside the main chuck 11. The vacuum exhaust path 11B communicates with a number of openings formed in the surface of the main chuck 11. At the side of the circumferential surface of the main chuck 11, the exhaust path 11B is connected to a vacuum exhaust apparatus (not shown). This vacuum exhaust apparatus expels an exhaust gas from the exhaust path 11 and causes the wafer W to be attracted toward the main chuck 11 by suction by utilization of the openings.

The main chuck 11 has a gas flow path 11C and this path 11C is open at a position radially outward of the wafer W. Through this gas flow path 11C, a low-pressure inert gas (e.g., nitrogen gas) is supplied to the sealed space which a ring-like seal member (described below) defines between the main chuck 11 and the contactor 12.

Like the main chuck 11, the contactor 12 is provided with a heater 36 and a refrigerant path 37. Under the control of the temperature controller 35, the heater 36 and the temperature of the refrigerant flowing through the refrigerant path 37 are controlled. The temperature of the contactor 12 is thereby controlled, and the temperature in the gap between the contactor 12 and the wafer W is controlled for tests.

Inside the contactor 20, three temperature sensors 38 are provided. At least one of the temperature sensors 38 has an exposed tip end which is projected from the lower surface of the contactor 12. With this structure, the temperature of the seal space within which the wafer W is located can be measured directly. A ring-like seal member 39 is provided on the lower surface of the contactor 12. The outer diameter of this seal member 39 is smaller than that of the main chuck 11. When the probe terminals 12A of the contactor are simultaneously brought into contact with the wafer placed on the main chuck 11, the ring-like seal member 39 defines a hermetically sealed space between the main chuck 11 and the contactor 12.

As the probe terminals 12A of the contactor 12, a variety of terminals, such as bumps and probing needles, can be employed. The probe terminals 12A of the contactor 12 should not be shifted from the electrode pads of a wafer W even under the temperature conditions for the test. For this reason, it is desired that the coefficient of thermal expansion of the contactor 12 be equal or very close to that of the wafer W.

It is preferable that the wiring of chips and the electrode pads be formed of a material having a good electrical conductivity, such as aluminum or copper. For flip chip installation, it is desirable that the electrode pads be formed of soldered bumps.

A description will be given of the operation of the wafer testing apparatus 10 with reference to FIGS. 1–5. First of all, the wafer transport mechanism 30 takes one wafer W out from the cassette C inside the transport chamber 19. While the wafer W is being transported by the wafer transport mechanism 30, pre-alignment is performed for the wafer W by the sub-chuck 31. Thereafter, the wafer W is conveyed onto the main chuck 11 by the wafer transport mechanism 30. In the meantime, the main chuck 11 is heated or cooled to a predetermined temperature by the heater or the refrigerant (ethylene glycol) flowing through the refrigerant path 33, and this temperature control is executed under the control of the temperature controller 35. The temperature of the main chuck 11 is constantly measured by the temperature sensors 34, and based on the measured temperatures the temperature controller 35 controls the main chuck 11 to have a temperature suitable for tests (e.g., 180° C.). Under the control of the temperature controller 35, the heater 36 controls the temperature of the contactor 12 such that it is equal to that of the main chuck 11.

In the test chamber 18, the X-Y direction driving mechanism 24 moves the main chuck 11 until the lower CCD camera 26B comes to the position under the contactor 12. This movement of the main chuck 11 is executed before the wafer W is transported thereto. Further, the lower CCD camera 26B is moved up until it comes to the focal position of the probe terminals 12A. At this position, the lower CCD camera 26B can recognize the probe terminals 12A with a low magnification. Then, the lower CCD camera 26B moves to the region under the contactor 12, as shown in FIG. 3A, for example. The CCD camera checks the probe terminal 12A corresponding to the electrode pad P1 (FIGS. 5A and 5B) which is at one corner of the chip Ti whose data is registered in the memory 3 of the contactor 12 beforehand. After checking the probe terminal 12A, the lower CCD camera 26B takes it's image. The image of the probe terminal 12A is displayed on the screen 21A with reference to the (+) mark in the center of the screen 21A. On the basis of the pulse signals which the encoder generates in accordance with the movement of the main chuck 11, the coordinate position (X1, Y1, Z1) of the probe terminal 12A in question is calculated by the central processing unit 20A. The coordinate position obtained thereby is registered in the memory 20C by the central processing unit 20A. Thereafter, the lower CCD camera 26B moves, in turn, to the positions right under the four probe terminals 12A corresponding to other four chips T2–T5, while rotating counterclockwise. In a similar manner to that described above, the coordinate positions (X2, Y2, Z2), (X3, Y3, Z3), (X4, Y4, Z4) and (X5, Y5, Z5) of the four probe terminals 12A are calculated in turn. These coordinate positions are registered in the memory 20C by the central processing unit 20A.

Subsequently, the optical axes of the upper and lower CCD cameras 26A and 26B are aligned with each other, as shown in FIG. 3B. The position designated by this alignment is used as a reference position. To be more specific, the wafer W placed on the main chuck 11 by the wafer transport mechanism 30 is held tight on the main chuck 11 by vacuum suction. The alignment bridge 26C moves in the region between the main chuck 11 and the contactor 12 and comes to a halt at the predetermined position which is below the contactor 12. The target 26E moves to the position which is above the lower CCD camera 26B, and the lower CCD camera 26B is adjusted such that its focal point is on the center of the target 26E, so that the lower CCD camera 26B can recognize the metallic thin film. The upper CCD camera 26A is also adjusted such that its focal position is on the center of the target 26E, so that the upper CCD camera 26A can recognize the metallic thin film. By this operation, the optical axes of the upper and lower CCD cameras 26A and 26B are aligned with each other. The intersection between the aligned optical axis and the plane to which the upper and lower CCD cameras 26A and 26B are brought into focus, is a reference position, whose coordinates are (Xo, Yo, Zo). The coordinates are calculated on the basis of the position of the main chuck 11, and the calculated coordinates are registered in the memory 20C. The distance for which the lower CCD camera 26B is moved until then is detected by the encoder, and the positional relationship between the position coordinates of the probe terminals 12A and the reference position coordinates are checked on the coordinate system.

Thereafter, the center and diameter of the wafer W are measured by means of the upper CCD camera 26A. To be more specific, the target 26E is retreated from the focal plane of the lower CCD camera 26B. When the main chuck 11 is moved by the X-Y direction driving mechanism 24, predetermined points on the wafer W, for example three points on a peripheral portion of the wafer W, are detected by the CCD camera 26A. On the basis of this detection, the central processing unit 20A calculates the center and diameter of the wafer W from the moving distance of the main chuck 11. The data obtained by this calculation are stored in the memory 20C. Subsequently, the upper CCD camera 26A observes the scribed lines on the wafer W with a low magnification, and the X and Y axes of the wafer W are rotated in the θ direction such that they coincide with the X and Y axes of the X-Y table (which is driven by the X-Y direction driving mechanism 24), respectively. As a result, the chips of the wafer W is aligned in the index-feed direction.

The position coordinates of the five probe terminals 12A of the contactor 12 and the position coordinates of the five electrode pads P on the wafer W are calculated in the manner described above. After this calculation, the wafer W is moved in the horizontal direction in such a manner that the X and Y coordinates (X, Y) of the positions of the five probe terminals 12A and the X and Y coordinates (X, Y) of the positions of the five electrode pads P coincide with each other. To be more specific, the central processing unit 20A calculates the horizontal distances between the five probe terminals 12A and the five chips T on the basis of their position coordinates (X, Y), and a control signal based on the calculated distances is supplied to the motor control unit 20D. Upon receipt of the control signal, the motor control unit 20D controls the driving of the X-Y direction driving mechanism 24, and the main chuck 11 is moved in the horizontal direction. The main chuck 11 is brought to a halt when the position coordinates of the five chips T and those of the contactor 12 coincide with each other and thus aligned in the vertical direction.

Further, the central processing unit 20A calculates the height at which the five probe terminals 12A are brought into contact with the respective five electrode pads P, on the basis of the Z-coordinate values of the contactor 12 and the Z-coordinate values of the chips T. A control signal based on this calculation is supplied from the central processing unit 20A to the motor control unit 20D. Upon receipt of the control signal, the motor control unit 20D drives the lift mechanism 25 to move the main chuck 11 upward. Accordingly, the electrode pads of the five chips T are brought into contact with the probe terminals 12A.

When the electrode pads P are reliably brought into electrical contact with the probe terminals 12A, all probe terminals 12A of the contactor 12 are simultaneously brought into contact with the corresponding electrode pads P of the wafer W. Simultaneous with this, the ring-like seal member 39 defines a sealed space between the main chuck 11 and the contactor 12. When the wafer W has just been brought into simultaneous contact with the contactor 12, a low-pressure nitrogen gas is supplied into the sealed spaced by way of the gas flow path 11C of the main chuck 11. As a result, the atmosphere of the low-pressure nitrogen gas is produced in the region between the main chuck 11 and the contactor 12. Until then, the wafer W, which is in contact with the contactor 12, is heated to the preset temperature.

Next, under the control of the first controller 17, the power supply source 16 and the reliability test mechanism 13 are connected to the matrix switch 15 through the switches 16A and 13A. As a result, the power supply voltage of the power supply source 16 is applied to all "good" chips of the wafer W, i.e., to all chips of the wafer W except for the "defective" chips. In addition, burn-in test pattern signals are supplied to the chips by a similar route, so as to execute a reliability test for each chip. On the basis of the measurement signals from the chips, the chips are tested to check whether or not they have a potential defect, and whether or not they are suitable for use. In this manner, the reliability test for the wafer W is executed, and the distribution of defective chips is obtained.

After the reliability test, the switch 13A operates under the control of the first controller 17, in such a manner that the reliability test mechanism 13 is disconnected from the matrix switch 15. Instead, the electric characteristic test mechanism 14 is connected to the matrix switch 15 by means of the switch 14A. The matrix switch 15 operates on the basis of the first controller 17, and high- and low-speed test pattern signals are supplied to the chips in a similar manner to that of the reliability test. Accordingly, the high- and low-speed tests are executed with respect to the chips. During the execution of the reliability test, the matrix switch is operated under the control of the first controller 17, and part of the chips (one or a number of chips) are disconnected from the reliability test mechanism and are connected to the electric characteristic test mechanism. High- and low-speed test patterns are sent to those chips, and high and low-speed tests are sequentially executed with respect to the selected chips in turn. On the basis of the measurement signals transmitted from the chips, the electric characteristics of the chips are checked, and the distribution of defective chips is obtained.

The high- and low-speed tests are executed after the reliability test or in combination therewith. The high- and low-speed tests are the tests which are executed for chips at the end of the test process. In the descriptions given so far, the high- and low-speed tests were explained as being executed at high temperature. When the tests are executed at a lower temperature, the refrigerant (e.g., ethylene glycol) cooled under the control of the temperature controller 35 is circulated through the main chuck 11 and the contactor 12, while cooling them to a predetermined temperature (e.g., −50° C.). After this cooling step, the high- and low-speed tests are executed in such a manner as described above.

At the end of the above tests, the power supply source 16 and the electric characteristic test mechanism 14 are disconnected from the matrix switch 15 under the control of the first controller 17. In addition, under the control of the second controller 20, the main chuck 11 is driven and the wafer W is returned to the standby position. Further, the wafer transport mechanism 30 inside the transport chamber 19 is driven, and the wafer is pulled out from the main chuck 11 and is returned into the cassette C.

Subsequently, the wafer to be tested next is taken out from the cassette C. After pre-alignment, the wafer W is transferred onto the main chuck 11 inside the test chamber 18. The tests described above are repeated with respect to this wafer W.

As described above, according to the present invention, the electric characteristic test and the reliability test can be successively executed with high efficiency by use of a single testing system. The throughput can be enhanced, the number of test units is small, and the test cost can be reduced.

According to the present embodiment, the temperature of the wafer W can be controlled with high efficiency during the test, and the reliability of the test is thus ensured.

Another embodiment of the present invention is shown in FIG. 6. The wafer testing apparatus 10A of this alternative embodiment is provided with a means for removing an oxide film, such as that formed by natural oxidation, from the electrode pads of the chips formed on a wafer W. In the embodiment, the means for removing the oxide film is specifically a plasma processing apparatus.

The test chamber which the alternative embodiment employs for testing the wafer W is similar to the test chamber described above. In the description below, therefore, reference will be made mainly to the plasma processing apparatus and the related structural components.

As shown in FIG. 6, the wafer testing apparatus 10A of the embodiment comprises a cassette storage chamber 41 located at the front (which is depicted in the lower portion of the Figure), a transport chamber 42 located in the back of the cassette storage chamber 41 and adapted to transfer wafers W, a test chamber 43 located on one side of the transport chamber 42, and a plasma processing chamber 44 located on another side of the transport chamber 42 and opposing the test chamber 43. In the plasma processing chamber 44, a wafer W is subjected to plasma processing (etching treatment), so as to remove an oxide film from the surfaces of the electrode pads of the wafer W (the electrode pads are formed of a conductive metal, such as aluminum or copper). After the plasma processing, a reliability test and an electric characteristic test are executed with respect to the wafer W in the test chamber 43.

According to the second embodiment, the electrode pads are cleared of oxide films before the execution of the tests. In other words, the tests can be executed with respect to the wafer W, with no need to scrape off the oxide films (which is scraped off by the over driving of the main chuck).

A vacuum exhaust apparatus (not shown) is connected to the cassette storage chamber 41, and the transport chamber 42 and the plasma processing chamber 44. By the vacuum exhaust apparatus, the interior of the plasma processing chamber 44 is controlled to be a highly-vacuum region suitable for etching treatment of oxide films. For example, the interior is controlled to be a region of scores of mTorr to 200 mTorr. The cassette storage chamber 41 and the transport chamber 42 are used as vacuum auxiliary chambers. Specifically, the communication between the transport chamber 42 and the plasma processing chamber 44 is allowed or prohibited by opening or closing a gate valve 45. Likewise, the communication between the transport chamber 42 and the test chamber 43 is allowed or prohibited by opening or closing a gate valve 46.

As shown in FIG. 6, a wafer transport mechanism 47 is arranged inside the transport chamber 42. The wafer transport mechanism 47 takes out the wafers W one by one from the cassette C of the cassette C stored in the cassette storage chamber 41, and transfers them onto the sub-chuck 48. After pre-alignment is executed with respect to a wafer on the sub-chuck 48, the wafer is transported to the plasma processing chamber 44 or the test chamber 43 by way of the open gate valves 45 and 46.

In FIG. 6, reference numeral 49 denotes a display device similar to that of the first embodiment.

The test chamber 43 of the second embodiment is similar to the test chamber 18 of the first embodiment in terms of structure. According to the second embodiment, however, an inert gas supply source 50 is connected to the test chamber through a pipe 51, and a pressure regulating valve 52 and a mass flow controller 52A are provided in the pipe 51. Owing to these structural members 52 and 52A, an inert gas (e.g., nitrogen gas) is supplied into the test chamber 43 from the inert gas supply source 50 at a predetermined flow rate, and a non-oxidation atmosphere containing mainly of nitrogen gas is created in the test chamber 43. Hence, no natural oxide film is formed on the electrode pads of the wafer W transported from the plasma processing chamber 44.

Although not shown in the drawings, a vacuum exhaustion apparatus is connected to the test chamber 43. When gases are discharged from the cassette storage chamber 41, the transport chamber 42 and the plasma processing chamber 44 by vacuum exhaustion, the nitrogen gas is discharged from the test chamber 43 in such a manner that there is constantly a nitrogen gas stream in the test chamber 43 (the stream is, for example, a horizontal gas flow). This technique is adopted to prevent natural oxidation of the electrode pads of the wafer W. The adoption of the technique is the difference the test chamber 43 of the second embodiment has over the test chamber 18 of the first embodiment.

The inner wall of the plasma processing chamber 44 is formed, for example, of anodized aluminum, and an air-tight chamber is defined inside the plasma processing chamber 44. A pair of parallel plate electrodes are arrange inside the air-tight chamber. The air-tight chamber is set in a highly-vacuum state (e.g., few score mTorr to 200 mTorr) by the vacuum exhaustion apparatus, and etching processing is executed in the air-tight chamber in this state.

Figure 7:
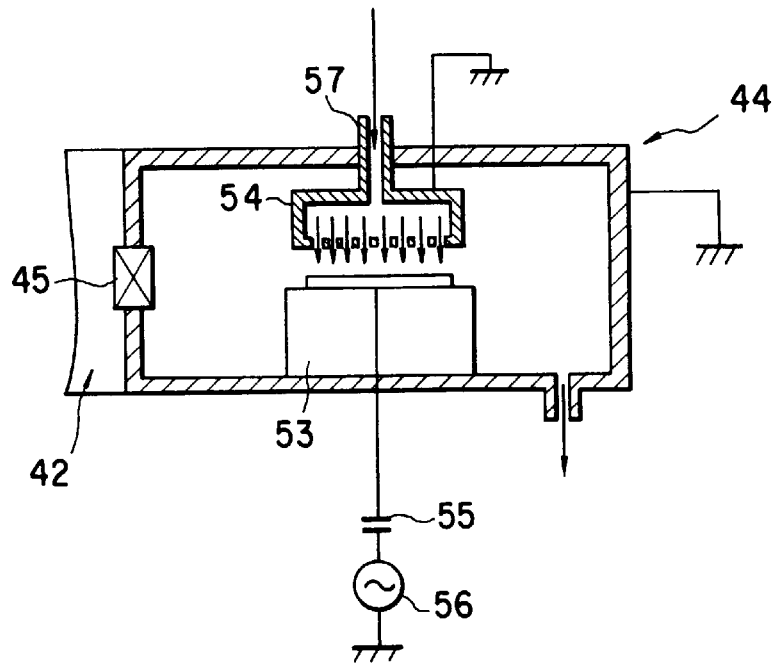
FIG. 7 is a sectional view illustrating the operating concept of the plasma processing chamber depicted in FIG. 6.

As shown in FIG. 7, the parallel plate electrodes are made up of a lower electrode 53 serving also as a support table, and an upper electrode 54 serving also as a process gas supply section. An electrostatic chuck (not shown) is provided on the upper surface of the lower electrode 53. Due to the provision of the electrostatic chuck, a wafer W is attracted by the Coulomb's force. A high-frequency power supply 56 is connected to the lower electrode 53 through a blocking capacitor 55. From the high-frequency power supply 56, high-frequency power of e.g., 13.56 MHz is applied to the lower electrode 53. The upper electrode 54 is a hollow disk, as shown in FIG. 7, and a gas pipe 57 is connected to the center of the top plate of the upper electrode 54. A large number of holes are dispersively formed in the bottom plate of the upper electrode 54.

As shown in FIG. 6, a source 58 for supplying a reactive gas (e.g., a chlorine-based gas such as a boron trichloride gas or a carbon tetrachloride gas) and a source 59 for supplying a carrier gas (e.g., an argon gas) are connected to the gas pipe 57. A pressure adjusting valve 60 and a mass flow controller 60A are provided in a branch pipe extending from the gas pipe 57; likewise, a pressure adjusting valve 61 and a mass flow controller 61A are provided in another branch pipe extending from the gas pipe 57. A reactive gas, such as a boron trichloride gas, is supplied to the plasma processing chamber 44 at a predetermined flow rate, while a carrier gas, such as the argon gas, is supplied to the plasma processing chamber 44 at a predetermined flow rate. (The predetermine flow rate is 100 to 500 sccm when it is calculated in terms of the boron trichloride gas.)

The plasma processing chamber 44 is kept in a state of a predetermined high degree of vacuum by the vacuum exhaustion apparatus. With the lower electrode 53 kept applied with predetermined high-frequency power, the reactive gas (the boron trichloride gas) is supplied from the upper electrode 54 at a predetermined flow rate. An electric discharge is made to take place between the lower electrode 53 and the upper electrode 54, thereby creating a plasma state of the boron trichloride gas.

Since the lower electrode 53 is applied with a self-bias voltage generated then, the reactive ions (BClx) in the plasma are accelerated vertically toward the lower electrode 53. The reactive ions are collided with the electrode pad, thus executing reaction etching by the reactive ions. An oxide film (e.g., aluminum oxide) is removed from the electrode pads, due to the reaction etching and due to the radical etching by the chlorine radicals. A description will now be given of the operational features of the wafer testing apparatus 10A described above.

By the vacuum exhaustion apparatus, the cassette storage apparatus 41 and the transport chamber 42 are set in a state suitable for use as vacuum auxiliary chambers. In addition, the plasma processing chamber 44 is set in a highly vacuum state. The wafer transport mechanism 47 takes one wafer W from the cassette C and places it onto the sub-chuck 48 inside the transport chamber 42. On the sub-chuck 48, the wafer W is pre-aligned, with the orientation flat as a reference. The gate valve 45 to the plasma processing chamber 44 is opened, thereby allowing the transport chamber 42 to communicate with the plasma processing chamber 44. The wafer transport mechanism 47 transports the wafer W placed on the sub-chuck 48 to the lower electrode 53 of the plasma processing chamber 44. After the wafer transport mechanism 47 moves out of the plasma processing chamber 44, the gate valve 45 is closed, thus shutting off the communication between the transport chamber 42 and the plasma processing chamber 44. At the time, the wafer W is secured to the lower electrode 53 by electrostatic suction performed by the electrostatic chuck.

Subsequently, a reactive gas (e.g., $BCl_3$) from the reactive gas supply source 58 and a carrier gas (e.g., Ar) from the carrier gas supply source 59 are supplied at predetermined flow rates (e.g., 500 sccm) in such a manner that the gases are mixed at a predetermined mixing ratio ($BCl_3$: Ar=4:1). The plasma processing chamber 44 is set in a state of a predetermined degree of vacuum by the vacuum exhaustion chamber.

After the plasma processing chamber 44 has attained the predetermined degree of vacuum, the lower electrode 53 is applied with high-frequency power. Due to the application of the high-frequency power, an electric discharge is made to take place between the lower electrode 53 and the upper electrode 54, and plasma is generated from the boron trichloride gas. The reactive ions from the boron trichloride gas are accelerated vertically toward the lower electrode 53, and the oxide aluminum film is removed from the electrode pads of the wafer W by both reactive etching and radical etching. As a result, the surface of the electrode pads are made purely of aluminum. As described above, after the oxide aluminum film is removed from the electrode pads, the supply of the born trichloride gas is stopped, the gate valve 45 is opened, the wafer transport mechanism 47 takes the wafer W, which has been subjected to the etching treatment, from the plasma processing chamber 44, the gate valve 45 is closed, and the wafer W is transported to the sub-chuck 48 inside the transport chamber 42. After the wafer W is pre-aligned on the sub-chuck 48, the gate valve 46 is opened, thus allowing communication between the transport chamber 42 and the test chamber 43. At the time, the nitrogen gas is supplied into the test chamber 43 from the inert gas supply source 50, and the test chamber is therefore in the non-oxidizing nitrogen gas atmosphere. In this nitrogen gas atmosphere, the reliability test and the high- and low-speed tests are executed with respect to the wafer W.

As described above, according to the second embodiment, the wafer W is processed in the plasma processing chamber 44 and an oxide aluminum film is removed from the electrode pads of the wafer W, before the reliability test and the high- and low-speed tests are executed with respect to the wafer W. Due to this feature, when the wafer W is tested, the main chuck 12 need not be over-driven. The required tests can therefore be executed, with no need to perform complex control.

Moreover, since the electrode pads are free of an aluminum oxide film, it is only required that the probe terminals 12A touch lightly. The load imposed on the probe terminals 12A can be reduced, and the probe terminals 12A are expected to have a long life.

Figure 8:
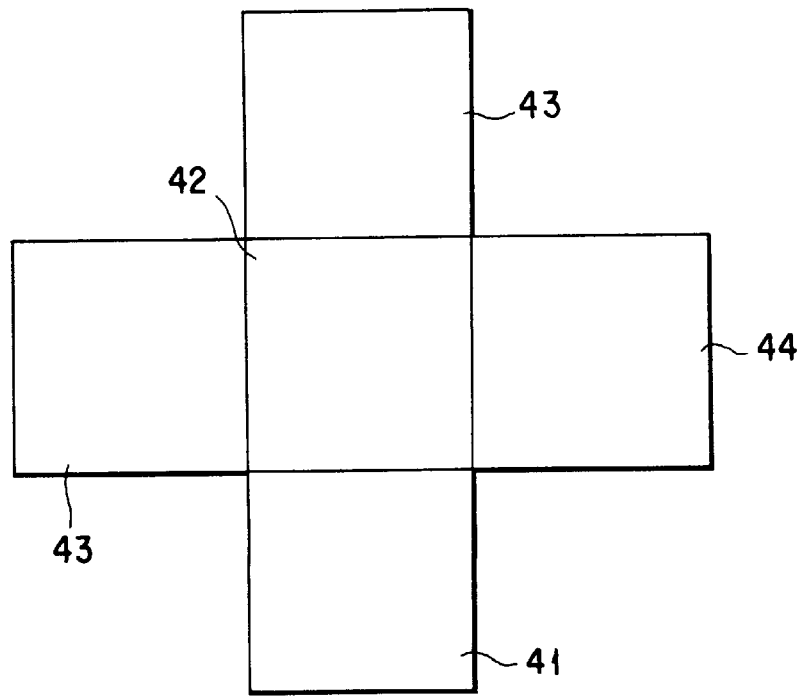
FIG. 8 is a plan view showing a wafer testing apparatus according to still another embodiment of the present invention.

In the above embodiment, the wafer testing apparatus is made up of one test chamber 43 and one plasma processing chamber 44. As shown in FIG. 8, however, the wafer testing apparatus may be made up of one plasma processing chamber 44 and a number of test chambers 43.

The wafer testing apparatus shown in FIG. 8 comprises a wafer transport chamber 42, a cassette storage chamber 41, a plasma processing chamber 44 and two test chambers 43. The wafer transport chamber 42 is located in the center, and the other chambers are arranged to surround it. A wafer in the cassette storage chamber 41 is transported to the plasma processing chamber 44 by way of the transport chamber 42. The wafer is subjected to etching treatment in the plasma processing chamber 44, and is then transported to the test chambers 43 by way of the transport chamber 42, for the execution of the tests. In comparison with the time required for plasma processing of the wafer, the time required for testing the wafer is very long. In view of this, it is desirable that a number of test chambers 43 be provided for a single processing chamber 44, so as to enhance the efficiency of the operation of the plasma processing chamber 44.

The present invention is in no way limited to the above embodiments.

For example, the contactor may be any type of mechanism as long as it comprises probe terminals that can be simultaneously brought into electric contact with the electrodes of the semiconductor elements formed on a semiconductor wafer.

In addition, the electric characteristic test mechanism of the present invention may be of any type as long as it enables tests for checking the electric characteristics of the semiconductor elements on the semiconductor wafer, including the high-speed and low-speed tests.

Further, the switch for switching the reliability test mechanism and the electric characteristic test mechanism from one to the other need not necessarily be a mechanical type. An electronic type switch may be used, if so desired.

The reliability test mechanism and the electric characteristic test mechanism may be assembled as one mechanism. In this case, the two test sections can be electrically switched from one to the other.

The vacuum suction mechanism of the present invention may be of any type as long as it enables a semiconductor wafer to be secured onto the surface of the main chuck.

In the foregoing embodiments, the seal member of the present invention completely surrounds the region defined between the contactor and the semiconductor wafer. Instead of this, however, the seal member may surround that region in part.

The controller employed in the present invention may be realized by an electronic circuit or a software program.

The temperature sensor employed in the present invention may operate on any principles or have any structure as long as it can be used to detect the temperatures under measurement.

A plasma processing apparatus is most desirable for use as the oxide film-removing mechanism of the present invention. Needless to say, however, any type of mechanism may be employed as long as it can remove an oxide film from the surfaces of the electrodes of the semiconductor elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A testing apparatus for testing semiconductor devices formed on a semiconductor wafer, comprising:

a main chuck having a surface on which a semiconductor wafer is placed;

a contactor which is brought into contact with the semiconductor wafer, said contactor having probe terminals which are simultaneously brought into electric contact with a plurality of semiconductor devices formed on the semiconductor wafer;

a reliability test mechanism configured to test reliability of the semiconductor devices;

an electric characteristic configured to test electric characteristics of the semiconductor devices; and a switch mechanism configured to switch between the reliability test mechanism and the electric characteristic test mechanism such that the reliability test mechanism and the electric characteristic test mechanism are sequentially connected to the contactor when the contactor is in contact with the semiconductor wafer placed on the main chuck.

2. A testing apparatus according to claim 1, wherein said main chuck includes a vacuum absorption mechanism for causing the semiconductor wafer to be absorbed on the surface of the main chuck, and at least one of the main chuck and the contactor includes gas supply means for supplying an inert gas into a gap which is formed between the contactor and the semiconductor wafer when the contactor and the semiconductor wafer are in contact with each other.

3. A testing apparatus according to claim 2, wherein one of said main chuck and said contactor includes a seal member for sealing a gap which is formed between the contactor and the semiconductor wafer when the contactor and the semiconductor wafer are in contact with each other.

4. A testing apparatus according to claim 1, wherein said contactor includes a temperature sensor for measuring a temperature of the semiconductor wafer.

5. A testing apparatus according to claim 1, further comprising:

an oxide film removing mechanism configured to remove an oxide film from surfaces of electrodes of the semiconductor devices formed on the semiconductor wafer.

6. A testing apparatus according to claim 5, wherein said oxide film removing mechanism is a plasma processing apparatus.

7. A testing method for testing semiconductor devices formed on a semiconductor wafer, comprising the steps of:

placing a semiconductor wafer on a main chuck;

bringing a contactor into contact with the semiconductor wafer, said contactor having probe terminals which are simultaneously brought into electric contact with electrodes of a plurality of semiconductor devices formed on the semiconductor wafer;

executing a reliability test by use of the contactor which is in contact with the semiconductor wafer; and executing an electric characteristic test by use of the contactor which is in contact with the semiconductor wafer.

8. A testing method according to claim 7, wherein the step of placing the semiconductor wafer on the main chuck is preceded by a step of removing an oxide film from the surfaces of the electrodes of the semiconductor devices formed on the semiconductor wafer.

9. A testing method according to claim 7, wherein the step of placing the semiconductor wafer on the main chuck is preceded by a step of subjecting the semiconductor wafer to plasma processing, to thereby remove an oxide film from the surfaces of the electrodes of the semiconductor devices formed on the semiconductor wafer.

10. A test method according to claim 7, wherein at least one of the reliability test and the electric characteristic test is executed, with an inert gas kept supplied to a gap between the contactor and the semiconductor wafer.

* * * * *